US011916532B2

United States Patent
McHugh (10) Patent No.: US 11,916,532 B2
(45) Date of Patent: *Feb. 27, 2024

(54) TRANSVERSELY-EXCITED FILM BULK ACOUSTIC RESONATORS WITH PIEZOELECTRIC DIAPHRAGM SUPPORTED BY PIEZOELECTRIC SUBSTRATE

(71) Applicant: Murata Manufacturing Co., Ltd., Nagaokakyo (JP)

(72) Inventor: Sean McHugh, Santa Barbara, CA (US)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/886,287

(22) Filed: Aug. 11, 2022

(65) Prior Publication Data

US 2022/0385263 A1 Dec. 1, 2022

Related U.S. Application Data

(63) Continuation of application No. 17/120,028, filed on Dec. 11, 2020, now Pat. No. 11,463,066.

(Continued)

(51) Int. Cl.
*H03H 9/02* (2006.01)
*H03H 3/02* (2006.01)
(Continued)

(52) U.S. Cl.
CPC .......... *H03H 9/02228* (2013.01); *H03H 3/02* (2013.01); *H03H 9/02031* (2013.01);
(Continued)

(58) Field of Classification Search
CPC .. H03H 9/02228; H03H 3/02; H03H 9/02031; H03H 9/174; H03H 9/176;
(Continued)

(56) References Cited

U.S. PATENT DOCUMENTS 5,853,601 A 12/1998 Krishaswamy et al.
6,540,827 B1 4/2003 Levy et al.
(Continued)

FOREIGN PATENT DOCUMENTS

WO 2016017104 A1 2/2016
WO 2018003273 A1 1/2018

OTHER PUBLICATIONS

Acoustic Properties of Solids, ONDA Corporation, Apr. 11, 2003, pp. 5.
(Continued)

*Primary Examiner* — Rakesh B Patel
*Assistant Examiner* — Jorge L Salazar, Jr.
(74) *Attorney, Agent, or Firm* — ARENTFOX SCHIFF LLP (57) ABSTRACT

Acoustic resonators and filter devices, and methods for making acoustic resonators and filter devices. An acoustic resonator includes a substrate having a surface and a single-crystal piezoelectric plate having front and back surfaces. The back surface is attached to the surface of the substrate except for a portion of the piezoelectric plate forming a diaphragm spanning a cavity in the substrate. A conductor pattern formed is formed on the front surface of the piezoelectric plate, including an interdigital transducer (IDT) with interleaved fingers of the IDT on the diaphragm. An insulating layer is formed between the piezoelectric plate and portions of the conductor pattern other than the interleaved fingers.

19 Claims, 7 Drawing Sheets

Related U.S. Application Data (60) Provisional application No. 63/091,552, filed on Oct. 14, 2020.

(51) Int. Cl.
*H03H 9/17* (2006.01)
*H03H 9/56* (2006.01)

(52) U.S. Cl.
CPC ............ *H03H 9/174* (2013.01); *H03H 9/176* (2013.01); *H03H 9/562* (2013.01); *H03H 9/564* (2013.01); *H03H 9/568* (2013.01); *H03H 2003/023* (2013.01)

(58) Field of Classification Search
CPC ........ H03H 9/562; H03H 9/564; H03H 9/568; H03H 2003/023; H03H 2003/021; H03H 9/173
USPC .................................................. 333/193–196
See application file for complete search history.

(56) References Cited

U.S. PATENT DOCUMENTS

| | | |
|---|---|---|
| 6,707,229 B1 | 3/2004 | Martin |
| 7,463,118 B2 | 12/2008 | Jacobsen |
| 7,535,152 B2 | 5/2009 | Ogami et al. |
| 7,684,109 B2 | 3/2010 | Godshalk et al. |
| 7,868,519 B2 | 1/2011 | Umeda |
| 8,278,802 B1 | 10/2012 | Lee et al. |
| 8,344,815 B2 | 1/2013 | Yamanaka |
| 8,829,766 B2 | 9/2014 | Milyutin et al. |
| 8,932,686 B2 | 1/2015 | Hayakawa et al. |
| 9,130,145 B2 | 9/2015 | Martin et al. |
| 9,219,466 B2 | 12/2015 | Meltaus et al. |
| 9,276,557 B1 | 3/2016 | Nordquist et al. |
| 9,369,105 B1 | 6/2016 | Li et al. |
| 9,425,765 B2 | 8/2016 | Rinaldi et al. |
| 9,525,398 B1 | 12/2016 | Olsson et al. |
| 9,748,923 B2 | 8/2017 | Kando et al. |
| 9,780,759 B2 | 10/2017 | Kimura et al. |
| 10,200,013 B2 | 2/2019 | Bower et al. |
| 10,491,192 B1 | 11/2019 | Plesski et al. |
| 10,601,392 B2 | 3/2020 | Plesski et al. |
| 10,637,438 B2 | 4/2020 | Garcia et al. |
| 10,756,697 B2 | 8/2020 | Plesski et al. |
| 10,790,802 B2 | 9/2020 | Yantchev et al. |
| 10,797,675 B2 | 10/2020 | Plesski |
| 10,826,462 B2 | 11/2020 | Plesski et al. |
| 11,463,066 B2 * | 10/2022 | McHugh ................ H03H 9/176 |
| 2002/0079986 A1 | 6/2002 | Ruby et al. |
| 2002/0158714 A1 | 10/2002 | Kaitila et al. |
| 2003/0199105 A1 | 10/2003 | Kub et al. |
| 2004/0233020 A1 | 11/2004 | Nakamura et al. |
| 2004/0261250 A1 | 12/2004 | Kadota et al. |
| 2007/0194863 A1 | 8/2007 | Shibata et al. |
| 2010/0064492 A1 | 3/2010 | Tanaka |
| 2010/0123367 A1 | 5/2010 | Tai et al. |
| 2011/0109196 A1 | 5/2011 | Goto et al. |
| 2011/0278993 A1 | 11/2011 | Iwamoto |
| 2013/0234805 A1 | 9/2013 | Takahashi |
| 2013/0321100 A1 | 12/2013 | Wang |
| 2014/0009032 A1 | 1/2014 | Takahashi et al. |
| 2014/0145556 A1 | 5/2014 | Kadota |
| 2014/0151151 A1 | 6/2014 | Reinhardt |
| 2014/0152145 A1 | 6/2014 | Kando et al. |
| 2014/0173862 A1 | 6/2014 | Kando et al. |
| 2015/0319537 A1 | 11/2015 | Perois et al. |
| 2015/0333730 A1 | 11/2015 | Meltaus et al. |
| 2016/0028367 A1 | 1/2016 | Shealy |
| 2016/0182009 A1 | 6/2016 | Bhattacharjee |
| 2017/0063332 A1 | 3/2017 | Gilbert et al. |
| 2017/0155373 A1 | 6/2017 | Ruby et al. |
| 2017/0179928 A1 | 6/2017 | Raihn et al. |
| 2017/0214387 A1 | 7/2017 | Burak et al. |
| 2017/0222622 A1 | 8/2017 | Solal et al. |
| 2017/0370791 A1 | 12/2017 | Nakamura et al. |
| 2018/0123016 A1 | 5/2018 | Gong et al. |
| 2018/0191322 A1 | 7/2018 | Chang et al. |
| 2019/0068164 A1 | 2/2019 | Houlden et al. |
| 2019/0123721 A1 | 4/2019 | Takamine |
| 2019/0131953 A1 | 5/2019 | Gong et al. |
| 2019/0273480 A1 | 9/2019 | Lin et al. |

OTHER PUBLICATIONS

Bahreynl, B., "Fabrication and Design of Resonant Microdevices," Norwich, NY, William Andrew, Inc., 2008.

Diaphragm Definition and Meaning, Merriam-Webster, since 1828 [retrieved from the Internet Apr. 5, 2023]. Retrieved from the Internet: <https://www.merriam-webster.com/dictionary/diaphragm#:~:text=%3A%20a%20dividing%20membrane%20or%20thin%20partition%20especially%20in%20a%20tube>, 13 pages.

Ekeom et al., "Solidly Mounted Resonator (SMR) FEM-BEM Simulation," Proceedings of the IEEE Ultrasonics Symposium, Nov. 2006, 5 pages.

International Search Report and Written Opinion in PCT/US2019/058632, dated Jan. 17, 2020, 8 pages.

International Search Report and Written Opinion in PCT/US2019/36433, dated Aug. 29, 2019, 9 pages.

Kadota et al., "Wideband acoustic wave resonators composed of hetero acoustic layer structure," Japanese Journal of Applied Physics, 2018, vol. 57, 07LD12, 4 pages.

Manohar, G., "Investigation of Various Surface Acoustic Wave Design Configurations for Improved Sensitivity," Doctoral Dissertation, Jan. 2017, University of South Florida, 112 pages.

Material Properties of Tibtech Innovations, TIBTECH Innovations, 2018.

Mizutaui et al., "Analysis of lamb wave propagation characteristics in rotated Y-cut X-propagation LiNbO3 plates," Electronics and Communications in Japan (Part 1: Communications), 1986, vol. 69, No. 4, pp. 47-55.

Moussa et al., "Review on Triggered Liposomal Drug Delivery with a Focus on Ultrasound," Current Cancer Drug Targets, 2015, vol. 15, No. 4, pp. 1-34.

Naumenko et al., "Optimal orientations of Lithium Niobate for resonator SAW filters," 2003 IEEE Ultrasonics Symposium, Oct. 5-8, 2003, Honolulu, Hawaii, pp. 2110-2113.

Olsson III et al., "A high electromechanical coupling coefficient SH0 Lamb wave lithium niobate micromechanical resonator and a method for fabrication," Sensors and Actuators A: Phyiscal, 2014, vol. 209, pp. 183-190.

Safari et al., "Piezoelectric for Transducer Applications," Elsevier Science Ltd., 2000, pp. 4.

Takai et al., "I.H.P.Saw Technology and its Application to Microacoustic Components (Invited)," 2017 IEEE International Ultrasonics Symposium (IUS), 2017, pp. 1-8.

Yang et al., "5 GHZ lithium niobate MEMS resonators with high FoM of 153," 2017 IEEE 30th International Conference on Micro Electro Mechanical Systems (MEMS), 2017, pp. 942-945.

Yang et al., "Toward Ka Band Acoustics: Lithium Niobat Asymmetrical Mode Piezoelectric MEMS Resonators," 2018 IEEE International Frequency Control Symposium (IFCS), 2018, 5 pages.

* cited by examiner

TRANSVERSELY-EXCITED FILM BULK ACOUSTIC RESONATORS WITH PIEZOELECTRIC DIAPHRAGM SUPPORTED BY PIEZOELECTRIC SUBSTRATE

RELATED APPLICATION INFORMATION

This patent is a continuation of co-pending application U.S. application Ser. No. 17/120,028, titled TRANSVERSELY-EXCITED FILM BULK ACOUSTIC RESONATORS WITH PIEZOELECTRIC DIAPHRAGM SUPPORTED BY PIEZOELECTRIC SUBSTRATE, filed Dec. 11, 2020, which claims priority from provisional patent application 63/091,552, filed Oct. 14, 2020, entitled XBAR WITH INSULATING LAYER BENEATH CONDUCTORS, both of which are incorporated herein by reference.

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to radio frequency filters using acoustic wave resonators, and specifically to filters for use in communications equipment.

Description of the Related Art

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a passband or stop-band depend on the specific application. For example, a "pass-band" may be defined as a frequency range where the insertion loss of a filter is better than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

High performance RF filters for present communication systems commonly incorporate acoustic wave resonators including surface acoustic wave (SAW) resonators, bulk acoustic wave (BAW) resonators, film bulk acoustic wave resonators (FBAR), and other types of acoustic resonators. However, these existing technologies are not well-suited for use at the higher frequencies and bandwidths proposed for future communications networks.

The desire for wider communication channel bandwidths will inevitably lead to the use of higher frequency communications bands. Radio access technology for mobile telephone networks has been standardized by the 3GPP ($3^{rd}$ Generation Partnership Project). Radio access technology for $5^{th}$ generation mobile networks is defined in the 5G NR (new radio) standard. The 5G NR standard defines several new communications bands. Two of these new communications bands are n77, which uses the frequency range from 3300 MHz to 4200 MHz, and n79, which uses the frequency range from 4400 MHz to 5000 MHz. Both band n77 and band n79 use time-division duplexing (TDD), such that a communications device operating in band n77 and/or band n79 uses the same frequencies for both uplink and downlink transmissions. Bandpass filters for bands n77 and n79 must be capable of handling the transmit power of the communications device. WiFi bands at 5 GHz and 6 GHz also require high frequency and wide bandwidth. The 5G NR standard also defines millimeter wave communication bands with frequencies between 24.25 GHz and 40 GHz.

The Transversely-Excited Film Bulk Acoustic Resonator (XBAR) is an acoustic resonator structure for use in microwave filters. The XBAR is described in U.S. Pat. No. 10,491,291, titled TRANSVERSELY EXCITED FILM BULK ACOUSTIC RESONATOR. An XBAR resonator comprises an interdigital transducer (IDT) formed on a thin floating layer, or diaphragm, of a single-crystal piezoelectric material. The IDT includes a first set of parallel fingers, extending from a first busbar and a second set of parallel fingers extending from a second busbar. The first and second sets of parallel fingers are interleaved. A microwave signal applied to the IDT excites a shear primary acoustic wave in the piezoelectric diaphragm. XBAR resonators provide very high electromechanical coupling and high frequency capability. XBAR resonators may be used in a variety of RF filters including band-reject filters, band-pass filters, duplexers, and multiplexers. XBARs are well suited for use in filters for communications bands with frequencies above 3 GHz.

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator.

DETAILED DESCRIPTION

Description of Apparatus

Figure 1:
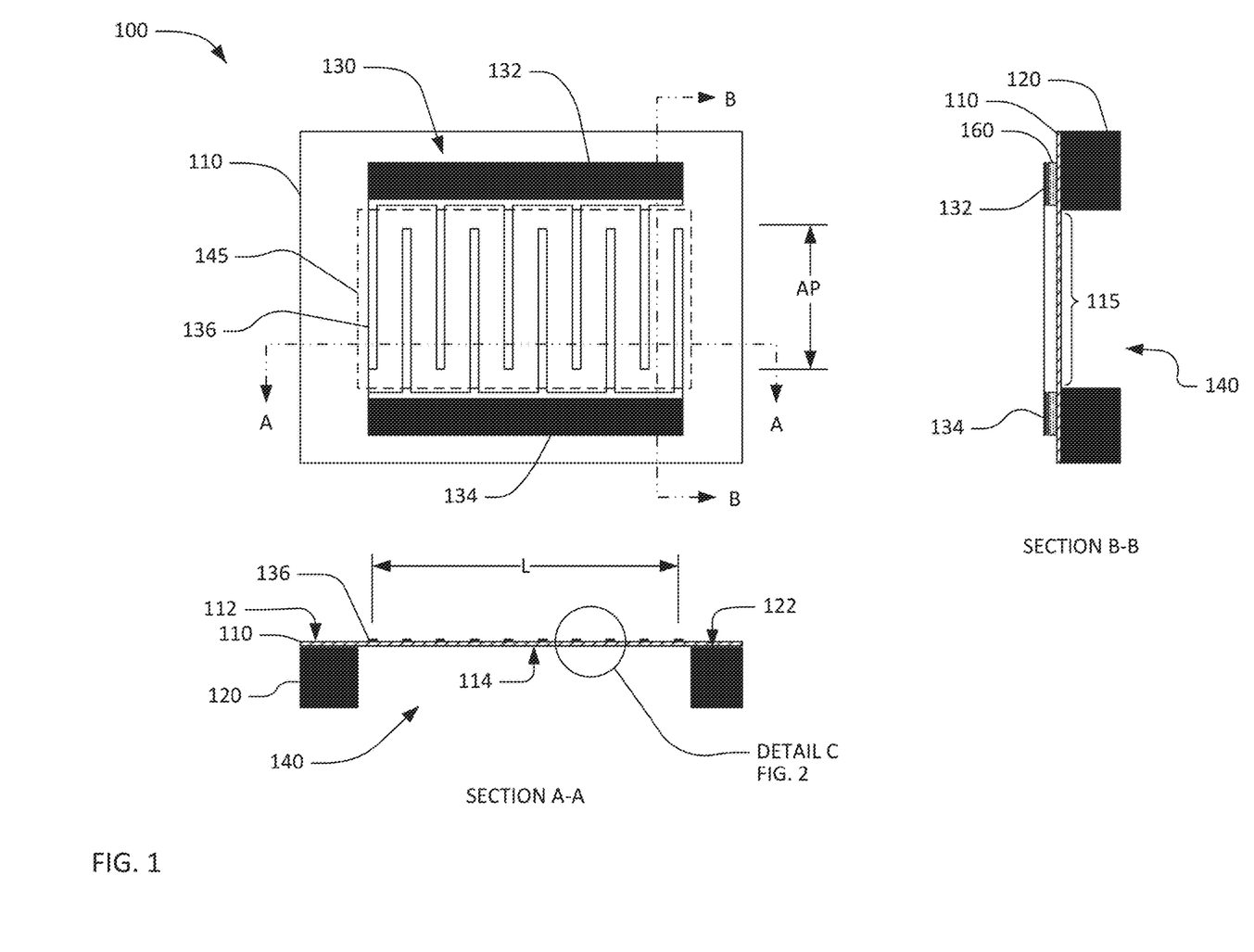
FIG. 1 is a schematic plan view and two schematic cross-sectional views of a transversely-excited film bulk acoustic resonator (XBAR).

FIG. 1 shows a simplified schematic top view and orthogonal cross-sectional views of a transversely-excited film bulk acoustic resonator (XBAR) 100. XBAR resonators such as the resonator 100 may be used in a variety of RF filters including band-reject filters, band-pass filters, duplexers, and multiplexers. XBARs are well suited for use in filters for communications bands with frequencies above 3 GHz.

The XBAR 100 includes a piezoelectric plate 110 having a front surface 112 and a back surface 114. The front and back surfaces are essentially parallel. "Essentially parallel" means parallel to the extent possible within normal manufacturing tolerances. The piezoelectric plate is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. XBARs may be fabricated on piezoelectric plates with various crystallographic orientations including Z-cut, rotated Z-cut, and rotated Y-cut.

A surface 122 of a substrate 120 is attached to a back surface 114 of the piezoelectric plate 110. A portion of the piezoelectric plate 110 is not attached to the substrate 120 and forms a diaphragm 115 spanning a cavity 140 formed in the substrate 120. The portion of the piezoelectric plate that spans the cavity is referred to herein as the "diaphragm" due to its physical resemblance to the diaphragm of a microphone. As shown in FIG. 1, the diaphragm 115 is contiguous with the rest of the piezoelectric plate 110 around all of a perimeter 145 of the cavity 140. In this context, "contiguous" means "continuously connected without any intervening item". The substrate 120 provides mechanical support to the piezoelectric plate 110. The piezoelectric plate 110 may be attached directly to the substrate 120 or may be attached to the substrate 120 via one or more intermediate material layers.

The substrate 120 may be, for example, silicon, sapphire, quartz, or some other material or combination of materials. The back surface 114 of the piezoelectric plate 110 may be bonded to the substrate 120 using a wafer bonding process. Alternatively, the piezoelectric plate 110 may be grown on the substrate 120 or attached to the substrate in some other manner. The piezoelectric plate 110 may be attached directly to the substrate or may be attached to the substrate 120 via one or more intermediate material layers (not shown in FIG. 1). The back surface 114 of the piezoelectric plate 110 and the surface of the substrate 120 may be attached using a wafer bonding process. Alternatively, the piezoelectric plate 110 may be grown the substrate 120.

The cavity 140 is an empty space within a solid body of the resonator 100. The cavity 140 may be a hole completely through the substrate 120 (as shown in Section A-A and Section B-B) or a recess in the substrate 120 (as shown subsequently in FIG. 3). The cavity 140 may be formed, for example, by selective etching of the substrate 120 before or after the piezoelectric plate 110 and the substrate 120 are attached.

The conductor pattern of the XBAR 100 includes an interdigital transducer (IDT) 130. The IDT 130 includes a first plurality of parallel fingers, such as finger 136, extending from a first busbar 132 and a second plurality of fingers extending from a second busbar 134. The first and second pluralities of parallel fingers are interleaved. The interleaved fingers overlap for a distance AP, commonly referred to as the "aperture" of the IDT. The center-to-center distance L between the outermost fingers of the IDT 130 is the "length" of the IDT.

The first and second busbars 132, 134 serve as the terminals of the XBAR 100. A radio frequency or microwave signal applied between the two busbars 132, 134 of the IDT 130 excites a primary acoustic mode within the piezoelectric plate 110. As will be discussed in further detail, the primary acoustic mode is a bulk shear mode where acoustic energy propagates along a direction substantially orthogonal to the surface of the piezoelectric plate 110, which is also normal, or transverse, to the direction of the electric field created by the IDT fingers. Thus, the XBAR is considered a transversely-excited film bulk wave resonator.

The IDT 130 is positioned on the piezoelectric plate 110 such that at least the fingers of the IDT 130 are disposed on the portion 115 of the piezoelectric plate that spans, or is suspended over, the cavity 140. As shown in FIG. 1, the cavity 140 has a rectangular shape with an extent greater than the aperture AP and length L of the IDT 130. A cavity of an XBAR may have a different shape, such as a regular or irregular polygon. The cavity of an XBAR may more or fewer than four sides, which may be straight or curved.

The IDT fingers 136 may be one or more layers of aluminum, an aluminum alloy, copper, a copper alloy, beryllium, gold, tungsten, molybdenum or some other conductive material. The IDT fingers are considered to be "substantially aluminum" if they are formed from aluminum or an alloy comprising at least 50% aluminum. The IDT fingers are considered to be "substantially copper" if they are formed from copper or an alloy comprising at least 50% copper. The IDT fingers are considered to be "substantially molybdenum" if they are formed from molybdenum or an alloy comprising at least 50% molybdenum. Thin (relative to the total thickness of the conductors) layers of other metals, such as chromium or titanium, may be formed under and/or over and/or as layers within the fingers to improve adhesion between the fingers and the piezoelectric plate 110 and/or to passivate or encapsulate the fingers and/or to improve power handling. The busbars (132, 134 in FIG. 1) of the IDT may be made of the same or different materials as the fingers.

An insulating layer 160, as shown in Section B-B of FIG. 1, can be between the busbars 132, 134, and the piezoelectric plate to reduce acoustic coupling between the busbars 132, 134 and the piezoelectric plate 110. The insulating layer 160 shown in Section B-B does not extend across the cavity 140. The insulating layer can be between portions of the conductor pattern other than the IDT fingers and the piezoelectric plate. A thickness of the insulating layer can be any suitable thickness. For example, the thickness can be in a range from 1 nm to a thickness of the conductor pattern. The insulating layer can be formed of one or more layers, which can be the same or different materials, including, but not limited to $SiO_2$, $Si_3N_4$, or other dielectric materials.

For ease of presentation in FIG. 1, the geometric pitch and width of the IDT fingers is greatly exaggerated with respect to the length (dimension L) and aperture (dimension AP) of the XBAR. An XBAR for a 5G device will have an IDT with more than ten parallel fingers. An XBAR may have hundreds, possibly thousands, of parallel fingers in the IDT. Similarly, the thickness of all elements is greatly exaggerated in the in the cross-sectional views.

Figure 2:
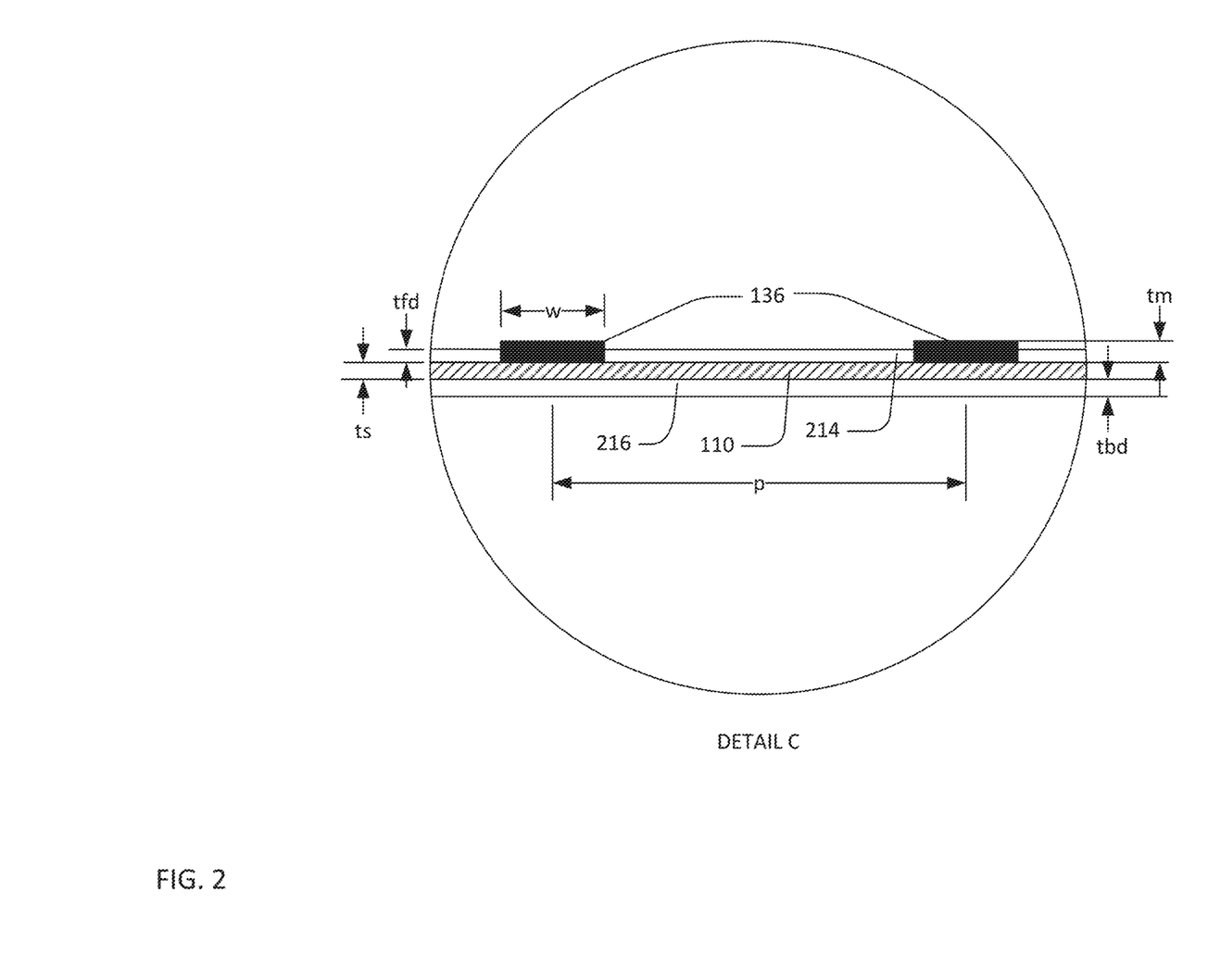
FIG. 2 is an expanded schematic cross-sectional view of a portion of the XBAR of FIG. 1.

FIG. 2 shows a detailed schematic cross-sectional view of the XBAR 100. The portion of the XBAR 100 shown in FIG. 2 is identified in FIG. 1 as "DETAIL C". The piezoelectric plate 110 is a single-crystal layer of piezoelectrical material having a thickness ts. ts may be, for example, 100 nm to 1500 nm. When used in filters for bands from 3.4 GHZ to 6 GHz (e.g. bands n77, n79, 5 GHz Wi-Fi™, 6 GHz Wi-Fi™,), the thickness ts may be, for example, 200 nm to 1000 nm.

A front-side dielectric layer 214 may be formed on the front side of the piezoelectric plate 110. The "front side" of the XBAR is the surface facing away from the substrate. The front-side dielectric layer 214 has a thickness tfd. The front-side dielectric layer 214 is formed between the IDT fingers 136. Although not shown in FIG. 2, the front-side dielectric layer 214 may also be deposited over the IDT fingers 136. A back-side dielectric layer 216 may be formed on the back side of the piezoelectric plate 110. The back-side dielectric layer 216 has a thickness tbd. The front-side and back-side dielectric layers 214, 216 may be a non-piezoelectric dielectric material, such as silicon dioxide or silicon nitride. tfd and tbd may be, for example, 0 to 500 nm. tfd and tbd are typically less than the thickness ts of the piezoelectric plate. tfd and tbd are not necessarily equal, and the front-side and back-side dielectric layers 214, 216 are not necessarily the same material. Either or both of the front-side and back-side dielectric layers 214, 216 may be formed of multiple layers of two or more materials.

Dimension p is the center-to-center spacing or "pitch" of the IDT fingers, which may be referred to as the pitch of the IDT and/or the pitch of the XBAR. Dimension w is the width or "mark" of the IDT fingers. The geometry of the IDT of an XBAR differs substantially from the IDTs used in surface acoustic wave (SAW) resonators. In a SAW resonator, the pitch of the IDT is one-half of the acoustic wavelength at the resonance frequency. Additionally, the mark-to-pitch ratio of a SAW resonator IDT is typically close to 0.5 (i.e. the mark or finger width is about one-fourth of the acoustic wavelength at resonance). In an XBAR, the pitch p of the IDT is typically 2 to 20 times the width w of the fingers. In addition, the pitch p of the IDT is typically 2 to 20 times the thickness is of the piezoelectric plate 212. The width of the IDT fingers in an XBAR is not constrained to be near one-fourth of the acoustic wavelength at resonance. For example, the width of XBAR IDT fingers may be 500 nm or greater, such that the IDT can be readily fabricated using optical lithography. The thickness tm of the IDT fingers may be from 100 nm to about equal to the width w. The thickness of the busbars (132, 134 in FIG. 1) of the IDT may be the same as, or greater than, the thickness tm of the IDT fingers.

Figure 3:
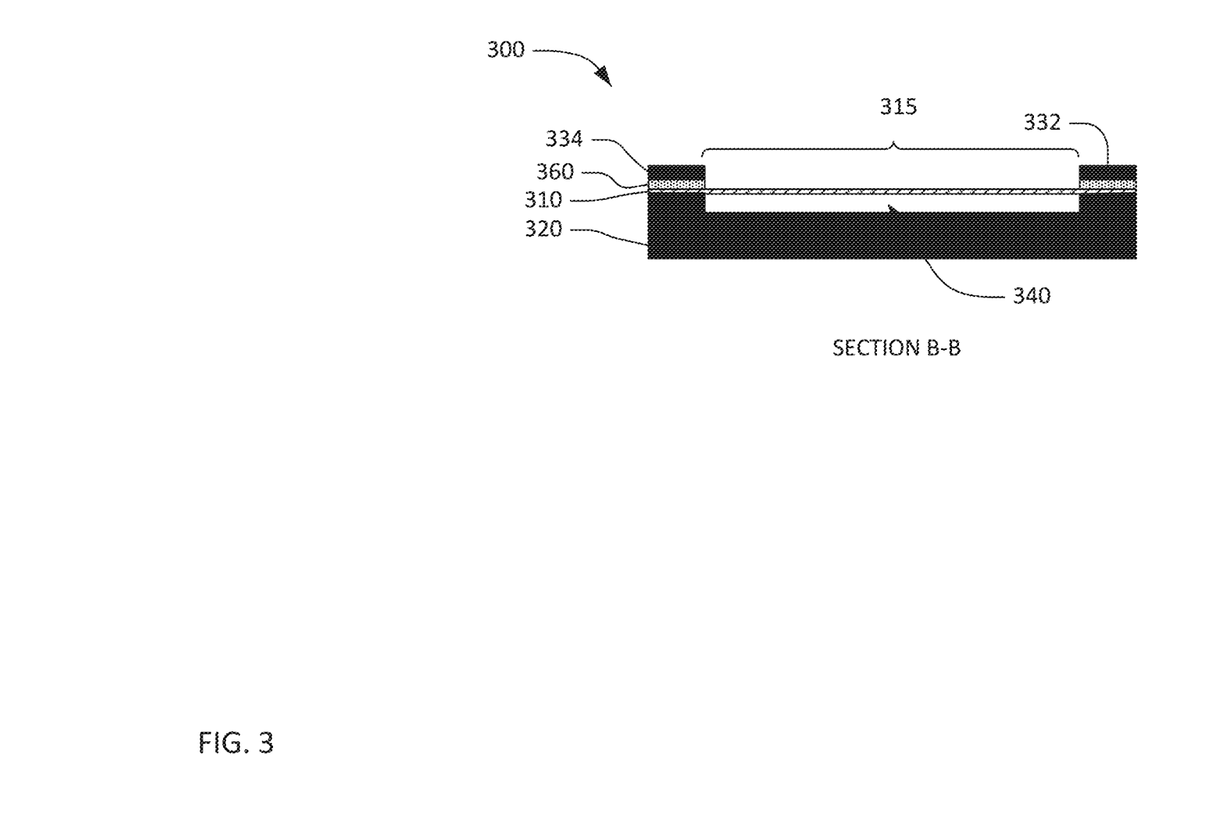
FIG. 3 is an alternative schematic cross-sectional view of the XBAR of FIG. 1.

FIG. 3 is an alternative cross-sectional view of an XBAR 300 along the section plane B-B defined in FIG. 1. In FIG. 3, a piezoelectric plate 310 is attached to a substrate 320. A portion of the piezoelectric plate 310 forms a diaphragm 315 spanning a cavity 340 in the substrate. The cavity 340 does not fully penetrate the substrate 320. Fingers of an IDT are disposed on the diaphragm 315. An insulating layer 360 is between busbars 332, 334, of the IDT and the piezoelectric plate 310. The cavity 340 may be formed, for example, by etching the substrate 320 before attaching the piezoelectric plate 310. Alternatively, the cavity 340 may be formed by etching the substrate 320 with a selective etchant that reaches the substrate through one or more openings (not shown) provided in the piezoelectric plate 310. In this case, the diaphragm 315 may be contiguous with the rest of the piezoelectric plate 310 around a large portion of a perimeter of the cavity 340. For example, the diaphragm 315 may be contiguous with the rest of the piezoelectric plate 310 around at least 50% of the perimeter of the cavity 340.

Figure 4:
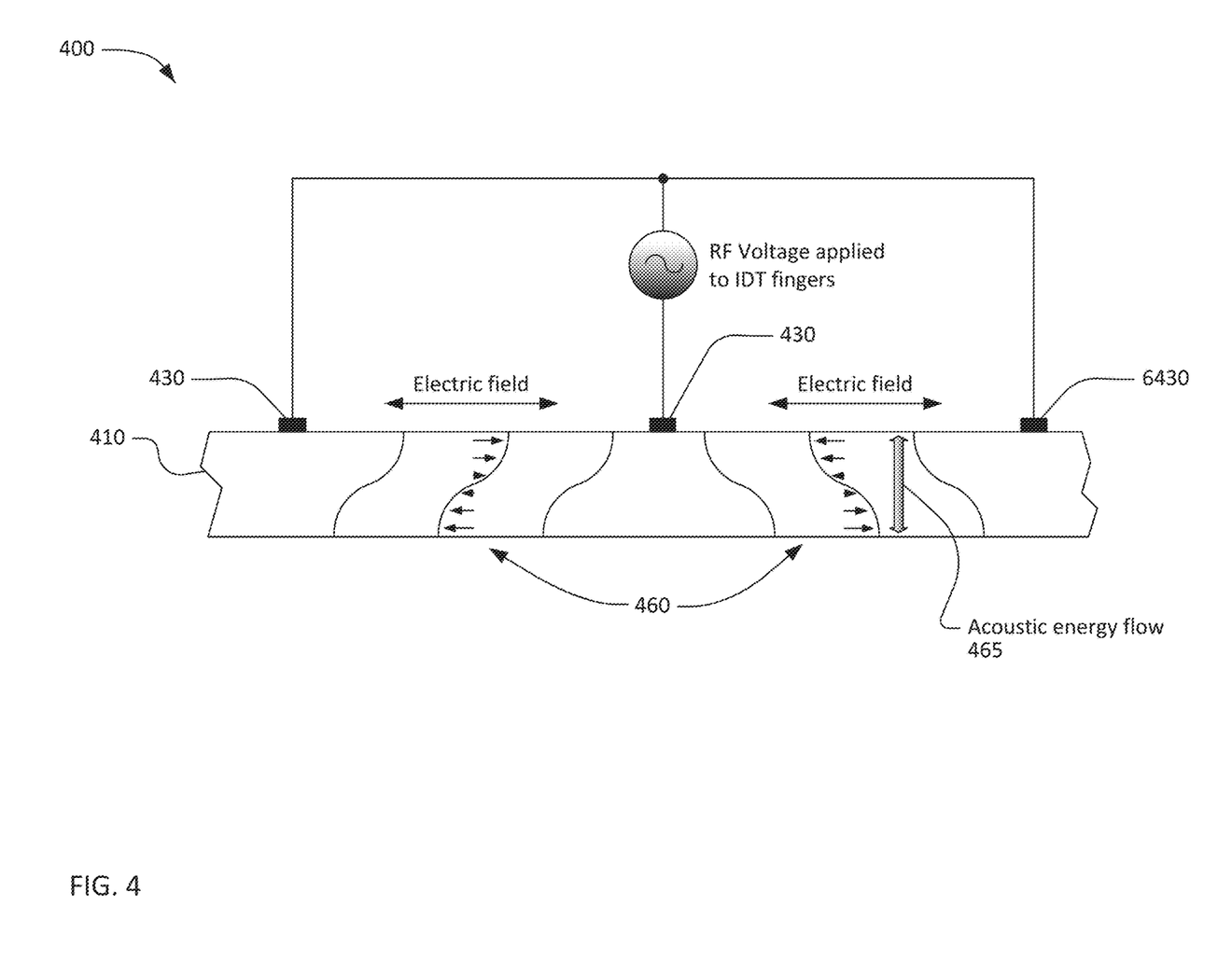
FIG. 4 is a graphic illustrating a shear primary acoustic mode in an XBAR.

FIG. 4 is a graphical illustration of the primary acoustic mode of interest in an XBAR. FIG. 4 shows a small portion of an XBAR 400 including a piezoelectric plate 410 and three interleaved IDT fingers 430. A radio frequency (RF) voltage is applied to the interleaved fingers 430. This voltage creates a time-varying electric field between the fingers. The direction of the electric field is primarily lateral, or parallel to the surface of the piezoelectric plate 410, as indicated by the arrows labeled "electric field". Since the dielectric constant of the piezoelectric plate is significantly higher than the surrounding air, the electric field is highly concentrated in the plate relative to the air. The lateral electric field introduces shear deformation, and thus strongly excites a shear-mode acoustic mode, in the piezoelectric plate 410. Shear deformation is deformation in which parallel planes in a material remain parallel and maintain a constant distance while translating relative to each other. A "shear acoustic mode" is an acoustic vibration mode in a medium that results in shear deformation of the medium. The shear deformations in the XBAR 400 are represented by the curves 460, with the adjacent small arrows providing a schematic indication of the direction and magnitude of atomic motion. The degree of atomic motion, as well as the thickness of the piezoelectric plate 410, have been greatly exaggerated for ease of visualization. While the atomic motions are predominantly lateral (i.e. horizontal as shown in FIG. 4), the direction of acoustic energy flow of the excited primary shear acoustic mode is substantially orthogonal to the surface of the piezoelectric plate, as indicated by the arrow 465.

An acoustic resonator based on shear acoustic wave resonances can achieve better performance than current state-of-the art film-bulk-acoustic-resonators (FBAR) and solidly-mounted-resonator bulk-acoustic-wave (SMR BAW) devices where the electric field is applied in the thickness direction. In such devices, the acoustic mode is compressive with atomic motions and the direction of acoustic energy flow in the thickness direction. In addition, the piezoelectric coupling for shear wave XBAR resonances can be high (>20%) compared to other acoustic resonators. High piezoelectric coupling enables the design and implementation of microwave and millimeter-wave filters with appreciable bandwidth.

Figure 5:
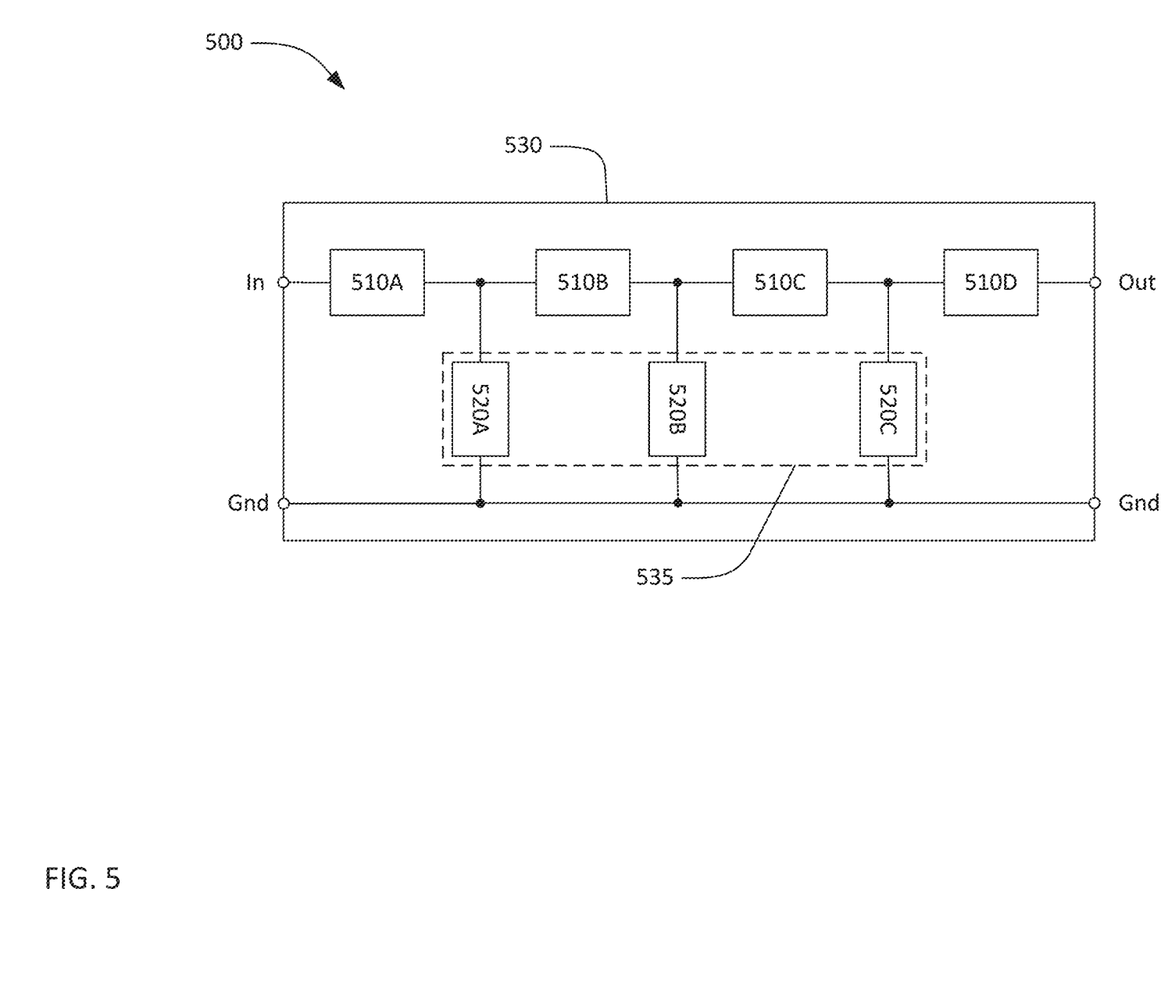
FIG. 5 is a schematic block diagram of a filter using XBARs.

FIG. 5 is a schematic circuit diagram and layout for a high frequency band-pass filter 500 using XBARs. The filter 500 has a conventional ladder filter architecture including four series resonators 510A, 510B, 510C, 510D and three shunt resonators 520A, 520B, 520C. The series resonators 510A, 510B, 510C, and 510D are connected in series between a first port and a second port (hence the term "series resonator"). In FIG. 5, the first and second ports are labeled "In" and "Out", respectively. However, the filter 500 is bidirectional and either port may serve as the input or output of the filter. The shunt resonators 520A, 520B, 520C are connected from nodes between the series resonators to ground. A filter may contain additional reactive components, such as inductors, not shown in FIG. 5. All the shunt resonators and series resonators are XBARs. The inclusion of four series and three shunt resonators is exemplary. A filter may have more or fewer than seven total resonators, more or fewer than four series resonators, and more or fewer than three shunt resonators. Typically, all of the series resonators are connected in series between an input and an output of the filter. All of the shunt resonators are typically connected between ground and the input, the output, or a node between two series resonators.

In the exemplary filter 500, the series resonators 510A, B, C, D and the shunt resonators 520A, B, D of the filter 500 are formed on a single plate 530 of piezoelectric material bonded to a silicon substrate (not visible). Each resonator includes a respective IDT (not shown), with at least the fingers of the IDT disposed over a cavity in the substrate. In this and similar contexts, the term "respective" means "relating things each to each", which is to say with a one-to-one correspondence.

Each of the resonators 510A, 510B, 510C, 510D, 520A, 520B, 520C in the filter 500 has a resonance where the admittance of the resonator is very high and an anti-resonance where the admittance of the resonator is very low. The resonance and anti-resonance occur at a resonance frequency and an anti-resonance frequency, respectively, which may be the same or different for the various resonators in the filter 500. In over-simplified terms, each resonator can be considered a short-circuit at its resonance frequency and an open circuit at its anti-resonance frequency. The input-output transfer function will be near zero at the resonance frequencies of the shunt resonators and at the anti-resonance frequencies of the series resonators. In a typical filter, the resonance frequencies of the shunt resonators are positioned below the lower edge of the filter's passband and the anti-resonance frequencies of the series resonators are position above the upper edge of the passband.

Various conductors in a filter may have sufficient voltage differences between them to excite shear waves in the piezoelectric plate between the resonators that can cause spurious modes and excessive loss. These shear waves can travel into the substrate and reflect from the back of the substrate resulting in multiple resonances. For example, a voltage difference between a busbar of one XBAR and a busbar of another XBAR can generate these undesirable acoustic waves. While the effect of the spurious modes may be mitigated by roughening surfaces of the substrate 120, causing acoustic energy to incoherently scatter, it is preferable to avoid the generation of these acoustic waves.

Figure 6:
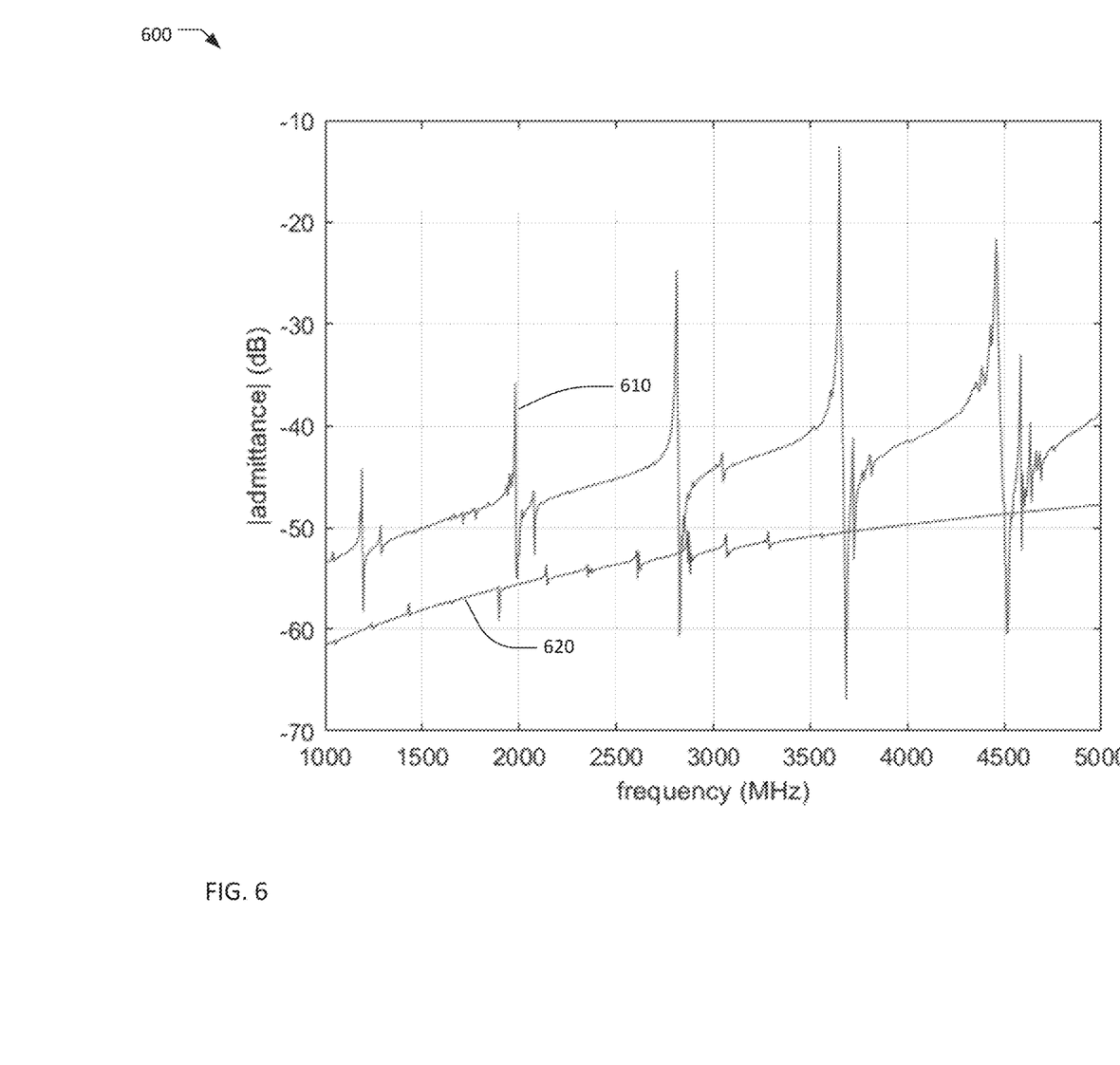
FIG. 6 is a chart of the absolute value of admittance versus frequency for devices with and without an insulating layer.

FIG. 6 is a chart 600 of absolute value of admittance as a function of frequency for simulations of two parallel conductors on a surface of a piezoelectric plate supported by a substrate. The parallel conductors are representative of signal and ground conductors (e.g., busbars of XBARs) in a filter. Curve 610 shows values for two parallel conductors with no insulating layer, indicating strong acoustic features and relatively high admittance. Curve 620 shows values for two parallel conductors similarly configured but with the addition of an insulating layer between the conductors and the piezoelectric plate. The admittance and magnitude of the acoustic features are decreased in curve 620, as compared to curve 610, due to the presence of the insulating layer between the piezoelectric plate and the conductors.

Description of Methods

Figure 7:
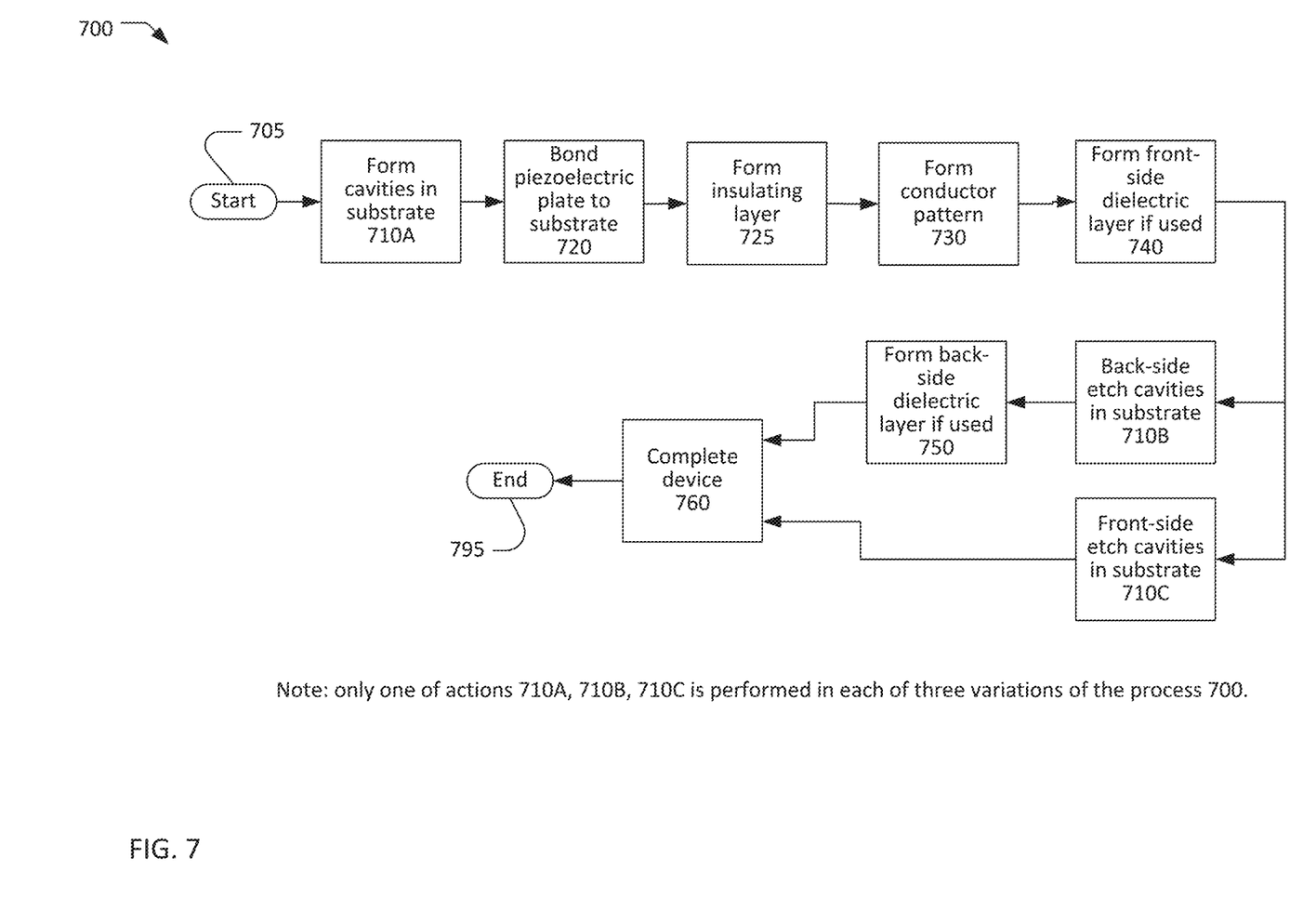
FIG. 7 is a flow chart of a process for fabricating an XBAR or a filter including XBARs.

FIG. 7 is a simplified flow chart showing a process 700 for making an XBAR or a filter incorporating XBARs. The process 700 starts at 705 with a substrate and a plate of piezoelectric material and ends at 795 with a completed XBAR or filter. The flow chart of FIG. 7 includes only major process steps. Various conventional process steps (e.g. surface preparation, cleaning, inspection, baking, annealing, monitoring, testing, etc.) may be performed before, between, after, and during the steps shown in FIG. 7.

The flow chart of FIG. 7 captures three variations of the process 700 for making an XBAR which differ in when and how cavities are formed in the substrate. The cavities may be formed at steps 710A, 710B, or 710C. Only one of these steps is performed in each of the three variations of the process 700.

The piezoelectric plate may be, for example, lithium niobate or lithium tantalate, and may be Z-cut, rotated Z-cut, rotated YX-cut, or some other cut. The substrate may preferably be silicon. The substrate may be some other material that allows formation of deep cavities by etching or other processing.

In one variation of the process 700, one or more cavities are formed in the substrate at 710A, before the piezoelectric plate is bonded to the substrate at 720. A separate cavity may be formed for each resonator in a filter device. The one or more cavities may be formed using conventional photolithographic and etching techniques. Typically, the cavities formed at 710A will not penetrate through the substrate.

At 720, the piezoelectric plate is bonded to the substrate. The piezoelectric plate and the substrate may be bonded by a wafer bonding process. Typically, the mating surfaces of the substrate and the piezoelectric plate are highly polished. One or more layers of intermediate materials, such as an oxide or metal, may be formed or deposited on the mating surface of one or both of the piezoelectric plate and the substrate. One or both mating surfaces may be activated using, for example, a plasma process. The mating surfaces may then be pressed together with considerable force to establish molecular bonds between the piezoelectric plate and the substrate or intermediate material layers.

At 725, an insulating layer is formed on portions or all of the piezoelectric plate. The insulating layer can be between portions of the conductor pattern other than between the IDT fingers and the piezoelectric plate. For example, the insulating layer 725 can be formed on portions that correspond to a subsequent position of busbars of IDTs and conductors interconnecting the IDTs. In another example, the insulating layer can be formed over all of the piezoelectric plate except on a diaphragm. The insulating layer can be formed of any one or more suitable dielectric materials, such as $SiO_2$ or $Si_3N_4$. The insulating layer can be formed by any suitable method, such as being patterned using a mask and etching.

A conductor pattern, including IDT fingers and busbars of each XBAR, is formed at 730 by depositing and patterning one or more conductor layers on the front side of the piezoelectric plate. The conductor pattern may be, for example, aluminum, titanium, chromium, tungsten, copper, molybdenum, gold, and/or platinum. Optionally, one or more layers of other materials may be disposed below (i.e. between the conductor layer and the piezoelectric plate), and/or on top of the conductor pattern. For example, a thin film of titanium, chrome, or other metal may be used to improve the adhesion between the conductor pattern and the piezoelectric plate. A conduction enhancement layer of gold, aluminum, copper or other higher conductivity metal may be formed over portions of the conductor pattern (for example the IDT busbars and interconnections between the IDTs). Only the busbars of the IDT can be formed on the insulating layer, or, alternatively, other portions or all of the conductor pattern can be formed on the insulating layer.

The conductor pattern may be formed at 730 by depositing one or more metal layers over the surface of the piezoelectric plate and/or the insulating layer. The excess metal may then be removed by etching through patterned photoresist. The conductor pattern can be etched, for example, by plasma etching, reactive ion etching, wet chemical etching, and other etching techniques.

Alternatively, the conductor pattern may be formed at 730 using a lift-off process. Photoresist may be deposited over the piezoelectric plate. and patterned to define the conductor pattern. The conductor pattern and, optionally, one or more other layers may be deposited in sequence over the surface of the piezoelectric plate. The photoresist may then be removed, which removes the excess material, leaving the conductor pattern.

At 740, a front-side dielectric layer may be formed by depositing one or more layers of dielectric material on the front side of the piezoelectric plate. The one or more dielectric layers may be deposited using a conventional deposition technique such as sputtering, evaporation, or chemical vapor deposition. The one or more dielectric layers may be deposited over the entire surface of the piezoelectric plate, including on top of the conductor pattern. Alternatively, one or more lithography processes (using photomasks) may be used to limit the deposition of the dielectric layers to selected areas of the piezoelectric plate, such as only between the interleaved fingers of the IDTs. Masks may also be used to allow deposition of different thicknesses of dielectric materials on different portions of the piezoelectric plate.

In a second variation of the process 700, one or more cavities are formed in the back side of the substrate at 710B. A separate cavity may be formed for each resonator in a filter device. The one or more cavities may be formed using an anisotropic or orientation-dependent dry or wet etch to open holes through the back side of the substrate to the piezoelectric plate. In this case, the resulting resonator devices will have a cross-section as shown in FIG. 1.

In the second variation of the process 700, a back-side dielectric layer may be formed at 750. In the case where the cavities are formed at 710B as holes through the substrate, the back-side dielectric layer may be deposited through the cavities using a conventional deposition technique such as sputtering, evaporation, or chemical vapor deposition.

In a third variation of the process 700, one or more cavities in the form of recesses in the substrate may be formed at 710C by etching the substrate using an etchant introduced through openings in the piezoelectric plate. A separate cavity may be formed for each resonator in a filter device.

In all variations of the process 700, the filter device is completed at 760. Actions that may occur at 760 include depositing an encapsulation/passivation layer such as $SiO_2$ or $Si_3O_4$ over all or a portion of the device; forming bonding pads or solder bumps or other means for making connection between the device and external circuitry; excising individual devices from a wafer containing multiple devices; other packaging steps; and testing. Another action that may occur at 760 is to tune the resonant frequencies of the resonators within the device by adding or removing metal or dielectric material from the front side of the device. After the filter device is completed, the process ends at 795.

CLOSING COMMENTS

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

The invention claimed is:

1. A filter device comprising:
    at least one piezoelectric layer attached directly or via one or more intermediate layers to a substrate of a resonator of the filter device, portions of the at least one piezoelectric layer forming one or more diaphragms spanning respective cavities of the filter device;
    a conductor pattern at the at least one piezoelectric layer and including a plurality of interdigital transducers (IDTs) of a respective plurality of acoustic resonators, interleaved fingers of each of the plurality of IDTs on one of the one or more diaphragms of the at least one piezoelectric layer; and
    an insulating layer disposed between the at least one piezoelectric layer and portions of the conductor pattern other than the interleaved fingers,
    wherein the insulating layer is not disposed on the diaphragm one or more diaphragms.

2. The filter device of claim 1, wherein the insulating layer is not larger than the portions of the conductor pattern other than the interleaved fingers.

3. The filter device of claim 1, wherein the insulating layer is only disposed between the at least one piezoelectric layer and portions of the conductor pattern other than the interleaved fingers.

4. The filter device of claim 1, wherein the at least one piezoelectric layer and interleaved fingers of each of the plurality of IDTs are configured such that a radio frequency signal applied to the plurality of IDTs excites a primary shear acoustic mode in the one or more diaphragms.

5. The filter device of claim 1, wherein:
the at least one piezoelectric layer is one of lithium niobate and lithium tantalate, and
the at least one piezoelectric layer is one of Z-cut, rotated Z-cut, and rotated YX-cut.

6. The filter device of claim 1, wherein the insulating layer is comprised of one or both of $SiO_2$ and $Si_3N_4$.

7. The filter device of claim 1, wherein the insulating layer has a thickness in a range between 1 nm and a thickness of the conductor pattern.

8. The filter device of claim 1, wherein the insulating layer does not extend across the cavities.

9. The filter device of claim 1, wherein the portions of the conductor pattern comprise at least one busbar, and the insulating layer is between the at least one busbar and the at least one piezoelectric layer, and wherein the insulating layer is configured to reduce acoustic coupling between the at least one busbar and the at least one piezoelectric layer.

10. The filter device of claim 1 further comprising a dielectric layer on the at least one piezoelectric layer and between the interleaved fingers.

11. A method of fabricating a filter device comprising:
attaching at least one piezoelectric layer to a substrate directly or via one or more intermediate layers, the at least one piezoelectric layer having portions that form one or more diaphragms spanning respective cavities of the filter device;
forming an insulating layer on the at least one piezoelectric layer; and
forming a conductor pattern comprising a plurality of interdigital transducers (IDTs) of a respective plurality of acoustic resonators on the at least one piezoelectric layer, interleaved fingers of each of the plurality of IDTs on the one or more diaphragms of the at least one piezoelectric layer, wherein the insulating layer is disposed between the at least one piezoelectric layer and portions of the conductor pattern other than the interleaved fingers of each of the plurality of IDTs,
wherein the insulating layer is only disposed between the at least one piezoelectric layer and portions of the conductor pattern other than the interleaved fingers.

12. The method of claim 11, wherein the insulating layer is not larger than the portions of the conductor pattern other than the interleaved fingers.

13. The method of claim 11, further comprising forming a dielectric layer on the at least one piezoelectric layer and between the interleaved fingers.

14. The method of claim 11, further comprising configuring the at least one piezoelectric layer and interleaved fingers of each of the plurality of IDTs such that a radio frequency signal applied to the plurality of IDTs excites a primary shear acoustic mode in the one or more diaphragms.

15. The method of claim 11, wherein:
the at least one piezoelectric layer is one of lithium niobate and lithium tantalate, and
the at least one piezoelectric layer is one of Z-cut, rotated Z-cut, and rotated YX-cut.

16. The method of claim 11, wherein the insulating layer is comprised one or both of $SiO_2$ and $Si_3N_4$.

17. The method of claim 11, wherein the insulating layer has a thickness in a range between 1 nm and a thickness of the conductor pattern.

18. The method of claim 11, wherein the conductor pattern comprises at least one busbar, and the insulating layer is between the at least one busbar and the at least one piezoelectric layer, and wherein the insulating layer is configured to reduce acoustic coupling between the busbar and the at least one piezoelectric layer.

19. The method of claim 11, wherein the insulating layer does not extend across the respective cavities.

* * * * *